United States Patent
Lazarev (10) Patent No.: US 7,291,223 B2
(45) Date of Patent: *Nov. 6, 2007

(54) EPITAXIAL ORGANIC LAYERED STRUCTURE AND METHOD FOR MAKING

(75) Inventor: Pavel I. Lazarev, Belmont, CA (US)

(73) Assignee: Nitto Denko Corporation, Ibaraki-shi (JP)

( * ) Notice: Subject to any disclaimer, the term of this patent is extended or adjusted under 35 U.S.C. 154(b) by 394 days.

This patent is subject to a terminal disclaimer.

(21) Appl. No.: 10/947,041

(22) Filed: Sep. 21, 2004

(65) Prior Publication Data

US 2005/0103258 A1    May 19, 2005

Related U.S. Application Data

(60) Provisional application No. 60/505,737, filed on Sep. 24, 2003.

(51) Int. Cl.
*C30B 7/08* (2006.01)

(52) U.S. Cl. .............................. 117/68; 117/69; 117/70; 117/927

(58) Field of Classification Search ................. 117/68, 117/69, 70, 927
See application file for complete search history.

(56) References Cited

U.S. PATENT DOCUMENTS

| | | |
|---|---|---|
| 5,315,129 A | 5/1994 | Forrest et al. |
| 5,739,296 A | 4/1998 | Gvon et al. |
| 6,049,428 A | 4/2000 | Khan et al. |
| 6,316,098 B1 | 11/2001 | Yitzchaik et al. |

2002/0061418 A1   5/2002  Imanishi

FOREIGN PATENT DOCUMENTS

EP          0 352 931 A1    1/1990

(Continued)

OTHER PUBLICATIONS

International Search Report, filed Feb. 11, 2005, Optiva, Inc., 7 pages.

(Continued)

*Primary Examiner*—Robert Kunemund
(74) *Attorney, Agent, or Firm*—Westerman, Hattori, Daniels & Adrian, LLP.

(57) ABSTRACT

The present invention relates to layered organic structures in which anisotropic crystalline seed layers control crystalline structure of the subsequent epitaxial organic layers. The structure comprises in sequence a substrate, a globally ordered crystalline seed layer with intermolecular spacing of 3.4±0.3 Å, and at least one epitaxial layer of an organic compound. The seed layer is comprised of disc-shaped molecules of at least one polycyclic organic compound with conjugated π-system. At least one layer of an organic compound is epitaxially deposited onto the seed layer. The present invention also provides a method for obtaining a layered organic structure. The method comprises forming of a globally ordered anisotropic crystalline seed layer on a substrate by means of the Cascade Crystallization Process. The seed layer has an intermolecular spacing of 3.4±0.3 Å and it is formed by rodlike supramolecules comprised of disc-shaped molecules of at least one polycyclic organic compound with conjugated π-system. Epitaxially depositing one epitaxial organic layer from the vapor or liquid phase onto the seed layer so as to obtain a layered organic structure.

39 Claims, 3 Drawing Sheets

FOREIGN PATENT DOCUMENTS

| | | |
|---|---|---|
| EP | 0 502 682 A2 | 9/1992 |
| EP | 0 502 682 A3 | 9/1992 |
| EP | 1 081 774 A2 | 3/2001 |
| WO | WO 02/63660 A | 8/2002 |

OTHER PUBLICATIONS

P. Lazarev, K. Lokshin, and V. Nazarov, "X-Ray Diffraction By Large Area Organic Crystalline Nano-Films", Mol. Materials 2001, vol. 14, pp. 303-311, pp. 303-311.

EPITAXIAL ORGANIC LAYERED STRUCTURE AND METHOD FOR MAKING

CROSS REFERENCE TO RELATED APPLICATIONS

This application claims the priority of the U.S. Provisional Patent Application Ser. No. 60/505,737, filed Sep. 24, 2003, the disclosure of which is hereby incorporated by reference in its entirety.

FIELD OF THE INVENTION

The present invention relates to organic layered structures in which an anisotropic crystalline seed layer controls crystalline structure of the subsequent epitaxial organic layers. In another aspect of the invention, a method for obtaining such a layered organic structure is disclosed.

BACKGROUND OF THE INVENTION

The state of the art in film manufacturing is known as epitaxial growth. Epitaxy (from Greek epi meaning <<on>> and taxis meaning <<ordered arrangement>>) refers to ordered growth of a layer of a given material on the surface of a substrate, whereby the crystal structure and orientation of the growing layer reproduce those of the substrate. The epitaxial growth of single crystal layers of inorganic materials on inorganic substrates is widely used in modern semiconductor technology. There are two basically different processes: (i) gas- or vapor-phase epitaxy (VPE), whereby thin layers are deposited onto substrates from gas or vapor mixtures, and (ii) liquid-phase epitaxy (LPE), whereby the growth proceeds from liquid solutions or melts. In the former process (VPE), atoms of an inorganic material to be deposited are vaporized in vacuum or in a buffer gas atmosphere, transferred by diffusion or convection driven by the temperature gradient from the source occurring at a higher temperature to a colder substrate, and deposited there in the form of a thin layer. Atoms of the inorganic deposit migrate over the substrate surface until occupying a position characterized by a minimum energy at an active surface center. The role of such active centers can perform, in particular, by the various irregularities of the surface structure. In the course of the epitaxial layer growth, new irregularities and, hence, active centers can appear. Alternatively, when supersaturation exceeds the critical level, atoms exhibit condensation into a liquid phase or crystallize in the gas phase in the region of lower temperatures at the substrate. In this case, atomic agglomerates in the form of liquid drops or solid microcrystals are deposited onto the substrate surface. Sufficiently small microcrystals can be oriented on the surface, while large crystals settle with an arbitrary orientation. In the latter case, the system exhibits the growth of unoriented polycrystalline layer. It must be noted that epitaxial growth requires using crystalline substrates with parameters of the crystal unit cell matched with those in the growing thin crystal layer. In this case, the growing crystal structure repeats that of the substrate. The substrate-induced ordering of the epitaxial layer (epilayer) is explained by the tendency of any system to possess a minimum free energy. This trend is manifested in that the nuclei of the epitaxial layer acquire the orientation corresponding to a minimum free energy, which is possible when there is a certain correspondence between the arrangement of atoms in the adjacent crystal planes.

There are known methods for the epitaxial growth of thin layers composed of large anisotropic organic molecules on inorganic substrates. One method of the epitaxial growth of thin organic films (perylenetetracarboxylic dianhydride and perylene) on an inorganic semiconductor surface (e.g., Si (111) wafers) was described by U. Zimmermann, G. Schnitzler et al. [Epitaxial Growth and Characterization of Organic Thin Films on Silicon, Thin Solid Films 174, 85-88 (1989)]. An example when such an organic material (3,4,9,10-perylene-tetracarboxylic acid dianhydride (PTCDA)) evaporated onto Ag (111) substrate formed a highly ordered thin film was demonstrated by L. Chkoda, M. Schneider et al. [Temperature-Dependent Morphology and Structure of Ordered 3,4,9,10-Perylenetetracarboxylic Acid Dianhydride Thin Films on Ag (111), Chem. Phys. Lett. 371, 548-552 (2003)]. The results of investigation of the initial growth stages of the organic molecular semiconductor PTCDA films on In-terminated InAs (001) were reported by C. Kendrick and A. Kahn [Epitaxial Growth and Phase Transition in Multilayers of the Organic Semiconductor PTCDA on InAs (001), J. Crystal Growth 181, 181-192 (1977)].

The method of manufacturing of the ordered copper phthalocyanine (CuPc) films on graphite by molecular beam deposition in vacuum is known [Wataru Mizutani, Youichi Sakakibara et al., "Measurements of Copper Phthalocyanine Ultrathin Films by Scanning Tunneling Microscopy and Spectroscopy", Japanese Journal of Applied Physics, Vol. 28, No. 8, August, 1989, pp. L 1460-L 1463]. In this method the pressure in the vacuum chamber, prior to and during the deposition, is supported at a level $10^{-10}$ Torr and $2\times10^{-8}$ Torr, respectively. The rate of film growth is maintained at about 0.5 nm/min. The temperature of the substrates is held at 15° C. during the deposition. The orientation of the molecules on graphite is measured by X-ray diffraction. The CuPc molecules are mainly arranged with the molecular planes nearly parallel to the substrate, but there are weak diffraction peaks indicating the existence of the molecules perpendicular to the substrate. Average thicknesses of the CuPc films vary from 0.4 nm (about one layer) to 20 nm. In the films, which thickness is equal to approximately 20 nm, the grain structures are found. In the case of monolayer deposition of phthalocyanine on graphite, the molecules are thermally activated at room temperature and form the islands at stable sites. When more than one layer covers the substrate, the thermally activated motion is suppressed by the interaction between the neighboring molecules, so that the islands are formed on the surface of the films. In the course of formation of the films, the unevenness of the deposition can be caused by dust, defects of the substrate, etc. These nonuniformities can be the nuclei of the islands or the grains. As the film thickness increases, those nonuniformities also grow to give perpendicular arrangement of the molecules on the substrate. Thus, the known method does not allow making the globally oriented and anisotropic films.

There are several disadvantages inherent in inorganic single crystals, which limit the possibilities of using such crystals as substrates for epitaxial growth. In particular, the number of single crystal materials suited for epitaxial growth is rather restricted because the crystal surface can be reactive, and/or covered with oxides, and/or contain adsorbed water molecules. The substrate can be nontransparent, possess undesired electronic and/or thermal properties, and so on. The major restriction is based on the requirement of matched (coinciding or co-dimensional) crystal lattices of substrate and growing crystal layer.

There are many optical application requiring epitaxial layers possessing anisotropic optical properties. This implies that the substrate must possess anisotropic properties as well. This present invention is directed to method and structure which overcome many of the shortcomings of the methods of forming epitaxially grown layers of the prior art as described above.

SUMMARY OF THE INVENTION

It is an object of the present invention provides a method for obtaining a layered organic structure.

A procedure according to this method comprises several steps. The first step is preparation of a substrate. The second step is formation of a globally ordered anisotropic crystalline seed layer on said substrate by means of the Cascade Crystallization Process. The seed layer has an intermolecular spacing of 3.4±0.3 Å. The seed layer is formed by rodlike supramolecules comprised of disc-shaped molecules of at least one polycyclic organic compound with conjugated π-system. The third step is epitaxial deposition of at least one epitaxial organic layer onto the seed layer so as to obtain an organic layered structure wherein at least one additional layer is obtained by epitaxial growth on the seed layer.

It is another object of the invention of the present invention to provide a layered organic structure. The layered organic structure sequentially comprises a substrate, a globally ordered crystalline seed layer and at least one layer comprising organic compound which is epitaxially deposited onto said seed layer. The seed layer has an intermolecular spacing of 3.4±0.3 Å, and is formed by rodlike supramolecules comprised of disc-shaped molecules of at least one polycyclic organic compound with conjugated π-system.

The present invention is directed onto elimination of some disadvantages of known epitaxy methods surveyed above. The disclosed method allows forming the anisotropic globally ordered epitaxial layered structures on the basis of organic compounds. The disclosed method has no limitation concerned with the requirement of matching between crystal lattices of the substrate and the growing film. Therefore the present invention is not limited to a narrow list of substrate materials and compounds suitable for deposition.

In a preferred embodiment, the present invention provides a layered organic structure comprising in sequence a substrate, a globally ordered crystalline seed layer with an intermolecular spacing of 3.4±0.3 Å, and at least one epitaxial layer representing an organic compound. The seed layer is formed by rodlike supramolecules comprised of disk-shaped molecules of at least one polycyclic organic compound with conjugated π-system. At least one epitaxial layer of an organic compound is epitaxially deposited on said seed layer.

BRIEF DESCRIPTION OF THE DRAWINGS

Other objects and advantages of the present invention will become evident upon reading the detailed description of the invention and the appended claims provided below, and upon reference to the drawings, in which:

DETAILED DESCRIPTION OF THE INVENTION

In a first embodiment of the present invention, a method for obtaining a layered organic structure is disclosed. This method consists of several steps. The first step is preparing a substrate. The second step is forming a globally ordered anisotropic crystalline seed layer on said substrate by means of the Cascade Crystallization Process. The seed layer has an intermolecular spacing of 3.4±0.3 Å. The seed layer is formed by rodlike supramolecules comprised of disc-shaped molecules at least one polycyclic organic compound with conjugated π-system. The third step is depositing at least one epitaxial organic layer onto the seed layer to provide a layered organic structure wherein the at least one additional layer is epitaxial with respect to the seed layer. In the disclosed method at least one epitaxial organic layer is deposited from the vapor or liquid phase.

In one embodiment, the substrate is made of any materials of the group comprising plastics, glasses, ceramics, metal-ceramic composites, and metals. In another embodiment, the substrate is made of a flexible material. In a further embodiment of the disclosed method, the substrate is made of a rigid material, wherein the surface of the substrate is flat, convex, concave, or possesses a geometric shape combining these forms. In a still another embodiment, at least a part of the substrate surface possesses anisotropic properties caused by special chemical bonds. In one variant of the disclosed method, at least a part of the substrate possesses uneven surface in which surface irregularities belong to the group including a surface texture, topography, geometry or relief. In another variant of the disclosed method, the surface irregularities are made of the substrate material. In still another variant of the disclosed method, the surface irregularities are made of a material different from the substrate material. In another embodiment of the disclosed method an additional step of one alignment layer is formed on said substrate prior to the step of formation of the seed layer. The alignment layer is formed on the substrate by method of oblique deposition of a material from the gas (vapor) phase. In particular, this method can use silicon dioxide as a material for the alignment layer. In another embodiment of the disclosed method, the alignment layer is made of a polymeric material oriented by rubbing in a preset direction. In another preferred embodiment, the disclosed invention uses a photosensitive polymeric material which is oriented by exposure to a polarized light.

The deposited seed layer possessing all the necessary physical properties, including crystallographic order and anisotropy can may be obtained, in particular, by the Cascade Crystallization Process.

This method for thin crystal layer manufacturing is described as Optiva-process [see: U.S. Pat. Nos. 5,739,296 and 6,049,428 and the following publications: P. Lazarev, et al., "X-ray Diffraction by Large Area Organic Crystalline Nanofilms", Molecular Materials, 14(4), 303-311 (2001) and Y. Bobrov "Spectral properties of Thin Crystal Film Polarizers" Molecular Materials, 14(3), 191-203 (2001)]. This process involves a chemical modification step and four steps of ordering during the crystal layer formation. In what follows, the above multistage process will be referred to as the Cascade Crystallization Process. The first step is the chemical modification step which introduces hydrophilic groups on the periphery of the molecule in order to impart amphiphilic properties to the molecules. Amphiphilic molecules stack together to form supramolecules, which is the first step of ordering. By choosing their special concentration, supramolecules are converted into a liquid-crystalline state to form a lyotropic liquid crystal (LLC), which is the second step of ordering. The lyotropic liquid crystal is deposited under the action of a shear force (or meniscus force) onto a substrate, so that the shear force (or the meniscus) direction determines the crystal axis direction in the resulting solid crystal layer. This shear-force-assisted directional deposition is the third step of ordering. The last, fourth ordering step of the Cascade Crystallization Process, is drying/crystallization, which converts the lyotropic liquid crystal into a solid crystal layer.

The Cascade Crystallization Process is simple and economically effective method. This method ensures a high degree of anisotropy and crystallinity of the final layers, offers the possibility of obtaining thin crystal layers of arbitrary shape (including multi-layer coatings on curvilinear surfaces), and is ecologically safe and low labor and energy consuming.

More specifically, the Cascade Crystallization Process is characterized by the following sequence of technological operations:

(1) Chemical modification of the compound and formation of supramolecules (the first step of ordering);

(2) Lyotropic liquid crystal formation (the second step of ordering);

(3) Application of a lyotropic liquid crystal of at least one organic compound onto a substrate;

(4) External liquefying action upon the lyotropic liquid crystal in order to decrease its viscosity;

(5) External aligning action upon the lyotropic liquid crystal in order to impart predominant orientation to particles of the colloid solution (the third step of ordering);

(6) Termination of the external liquefying action and/or application of an additional external action so as to restore the lyotropic liquid crystal viscosity on at least the initial level;

(7) Drying (the fourth step of ordering).

Below we describe some stages of the Cascade Crystallization Process in more detail.

The formation and structure of supramolecular aggregates in a lyotropic liquid crystal are determined by the concentration and geometry of molecules. In particular, the molecules may combine into lamellae, disk- or rod-like micelles, or asymmetric aggregates. Lyotropic liquid crystals usually appear as ordered phases composed of rodlike surfactant molecules in water. These asymmetric (anisometric) aggregates form a nematic liquid crystal or a smectic columnar phase of either nonchiral or chiral (cholesteric phase) nature.

The $\pi$—$\pi$ interaction of aromatic nuclei is the main mechanism of the molecular self-assembly of such liquid crystal molecules into supramolecular complexes. Hydrophilic ionic groups occurring at the periphery of a molecule render such organic molecules water-soluble. In recent years, these materials have been very extensively studied because of the possible application as internal polarizers in liquid crystal displays [T. Sergan, et al., Liquid Crystals, 5, 567-572 (2000)]. The field of technical applications of the liquid crystals can be expanded by using materials with a homogeneous orientation, whereby the liquid crystal director is lying in the plane of the anisotropic layer.

The external liquefying action upon the lyotropic liquid crystal (aimed at decreasing the viscosity) and the external aligning action upon the lyotropic liquid crystal (aimed at imparting a predominant orientation to the particles) can be performed simultaneously, or the external aligning action upon the lyotropic liquid crystal can be performed in the course of the external liquefying action.

The external liquefying action upon the lyotropic liquid crystal can be performed by local and/or total heating of the substrate from the side opposite to that on which the crystal film is formed, and/or by local and/or total heating of the substrate and/or the colloid solution layer from the side on which the anisotropic crystal layer is formed.

The external liquefying action upon said layer can be performed by a mechanical factor (for example, by shear) applied to the lyotropic liquid crystal layer on a substrate. In this case, we use the so-called thixotropic properties of a lyotropic liquid crystal. The concept of thixotropy describes the ability of a material to decrease viscosity under shear stress conditions and to restore the initial viscosity after termination of the shear. Highly thixotropic lyotropic liquid crystals have the ability of restoring the initial viscosity quickly after shear stress release. Thus, the viscosity of thixotropic materials is a function of the shear stress or shear rate. The viscosity of thixotropic materials diminishes, when the shear stress (or shear rate) increases.

There are several methods used for the orientation of liquid crystals. The process of orientation of thermotropic liquid crystals has been extensively studied from the standpoint of both basic problems and applications. As a rule, the orientation technologies employ a special unidirectional treatment of plates (substrates) contacting with the liquid-crystalline material or confining the liquid crystal volume. The external aligning action can be achieved through interaction of a lyotropic liquid crystal with a specially prepared substrate possessing anisotropic properties or covered with special alignment layers. According to the known method, the aforementioned substrates are coated with a special polymer (e.g., polyimide) or with a surfactant layer in order to obtain the desired alignment effects. Rubbing this polymer layer renders it capable of producing the aligning action.

The direction of rubbing (i.e., the direction of desired orientation of a thermotropic liquid crystal), is imparted to molecules in the liquid crystal film by means of anisotropic molecular interactions between the alignment film and molecules in the liquid crystal layer adjacent to the substrate. Preferred direction in the liquid crystal is determined by the unit vector n called the liquid crystal director. The aligning action of an anisotropic (e.g., rubbed) substrate upon a liquid crystal is based on the phenomenon called "anchoring". Anchoring is the standard means of orienting films in the displays based on thermotropic liquid crystals. The corresponding alignment techniques are well known for thermotropic liquid crystals. However, these methods may be inapplicable to lyotropic liquid crystals because of significant differences between the two classes of liquid crystal systems.

Lyotropic liquid crystals are much more difficult to orient by anchoring than thermotropic ones. This is related to the fact that most liquid crystals of the former type are based on amphiphilic substances (surfactants) soluble either in water or in oil. The amphiphilic molecules possess a polar (hydrophilic) head and a nonpolar (hydrophobic) aliphatic tail. When surfactant molecules are brought into contact with a substrate, the amphiphilic character results in the general case in their being oriented perpendicularly to the substrate surface. Both the polar hydrophilic head and the nonpolar hydrophobic tail are involved in the process of alignment, which results in the perpendicular orientation of molecules with respect to the substrate surface. This orientation, called homeotropic, is characterized by the preferred direction (perpendicular to the substrate surface), which also represents the optical axis of the liquid crystal.

The external alignment action upon the surface of an applied colloid solution can be produced by directed mechanical motion of at least one alignment device representing a knife and/or a cylindrical wiper and/or a flat plate oriented parallel to the applied layer surface or at an angle to this surface, whereby a distance from the substrate surface to the edge of the aligning instrument is preset so as to obtain a crystal film of the required thickness. The surface of the alignment instrument can be provided with a certain relief. The alignment can be performed with a heated instrument.

The external aligning action upon the lyotropic liquid crystal can be carried out by passage it through a spinneret under pressure in order to impart a predominant orientation to the colloid solution.

Restoration of said layer viscosity, at least on the initial level, can be achieved by terminating the liquefying action either in the course of or immediately after the alignment. After restoration of the lyotropic liquid crystal viscosity on the initial level, an additional aligning action upon the system can be produced in the same direction as that in the main alignment stage.

The drying should be performed at room temperature and a humidity of not less than 50%. Upon the drying stage, anisotropic crystal layers usually retain about 10% of solvent. Prior to performing subsequent stages according to the disclosed method, the content of solvent in the layer should be decreased to 2-3% by additional annealing.

Upon accomplishing the above operations, the Cascade Crystallization Process yields anisotropic crystal layers with globally ordered crystalline structure, which is characterized by intermolecular spacing of 3.4±0.3 Å along one of the optical axes.

The major advantage of the Cascade Crystallization Process is a weak dependence of the film on the surface defects. This weak dependence is due to the viscous and elastic properties of a lyotropic liquid crystal. The elastic layer of a liquid crystal prevents development of the defect field and inhibits defect penetration into the bulk of the deposited layer. Elasticity of the lyotropic liquid crystal acts against reorientation of the molecules under the action of the defect field. Molecules of the deposited material are packed into lateral supramolecules with a limited freedom of diffusion or motion.

The anisotropic crystalline layer produced by this method has a global order or, in other words, such layer has a globally ordered crystal structure. The global order means that the deposition process controls the direction of the crystallographic axes of the anisotropic crystalline layer over the entire layer surface or substrate surface. The external action, which is applied upon the formed anisotropic crystalline layer, does not disturb the global order of this layer. Thus, the anisotropic crystalline layer differs from a polycrystalline layer, in which the uniform crystalline structure is formed inside a separate crystal grain. The square of such a grain is much smaller than that of the layer surface or substrate. The substrate surface has a limited influence on the crystal structure of the anisotropic crystal layer. The anisotropic crystal layer can be formed on a part of the surface of the substrate or on the entire surface, depending in the system design requirements. In both cases, the anisotropic crystal layer is characterized by the global order.

According to the disclosed method, the epitaxially deposited organic layer comprises at least one modified organic compound of the general formula $$\{K\}(M)n,$$

where K is a polycyclic organic compound with conjugated π-system, M are modifying functional groups; and n is the number of functional groups.

In a possible embodiment of the disclosed method, the organic layer comprises at least one polycyclic organic aromatic conjugated compound or a derivative of such organic aromatic conjugated compound capable of forming supramolecular lyotropic liquid crystal phase. In another possible variant of the embodiment of the disclosed method, the organic compound comprises at least one derivative of said polycyclic organic aromatic conjugated compound, capable of forming supramolecular lyotropic liquid crystal phase.

In another preferred embodiment of the disclosed method, the organic layer is based on one material selected from the group comprising indanthrone (Vat Blue 4), 1,4,5,8-perylenetetracarboxylic acid dibenzoimidazole (Vat Red 14), 3,4,9,10-perylenetetracarboxylic acid dibenzoimidazole, quinacridone (Pigment Violet 19), 3,4,9,10-pyrylenetetracarboxylic dianhydride (PTCDA), bis-(1,2,5-thiadiazolo)-p-quinobis-(1,3-dithiol) (BTQBT), and aluminum tris(8-hydroxyquinoline) (Alq3).

A variant of the embodiment with an anisotropic film is possible, whereby said organic layer is based on any phthalocyanine (Pc) or their mixtures selected from the groups comprising metal-free phthalocyanine ($H_2Pc$), $Li_2Pc$, MgPc and other phthalocyanines with monovalent or divalent metal; AlClPc, AlOHPc and other phthalocyanines with a metal halide or a metal hydroxide; TiOPc, $SiCl_2Pc$, $Si(OH)_2Pc$ and other phthalocyanines with tetravalent metals; phthalocyanines in which the central metal ion is replaced by sulfonic acid (or its amide), carboxylic acid, alkyl, aryl, halide, nitro or another phthalocyanine ring; VOPc, CrPc, FePc, CoPc, NiPc, CuPc, ZnPc, $SnCl_2Pc$, PbPc, $Ge(OH)_2Pc$, InBrPc, or some other phthalocyanine.

In another embodiment of the disclosed method, the organic layer is based on one organic compound or their mixtures selected from the group comprising 3,3'-dichlorobenzidine, 2,7-diaminofluorenone, 2,6-diaminoanthraquinone, 2,7-diaminoanthraquinone, (p-aminophenyl)phenylamine, tris(p-aminophenyl)amine, 2,7-diaminodibenzothiophene sulfone, 2,7-diaminodibenzothiophene, 2-(p-aminophenyl)-6-aminobenzoxazole, bis(p-aminophenyl)amine, N-methylbis(p-aminophenyl)amine, 2,5-bis(p-aminophenyl)-1,3,4-oxadiazole, 1,6-diaminopyrene, 1,5-diaminonaphthalene, and some other analogous organic compounds. In one embodiment, at least one additional organic layer onto the seed layer is deposited in a buffer gas atmosphere. According to the disclosed method, the buffer gas used in the gas or vapor share epitaxial composition can be any gas selected from the list comprising He, Ar, Xe, and other inert gases, $N_2$, $CO_2$, and any other nonreactive gases.

In another preferred embodiment, the disclosed invention provides a layered organic structure. The structure comprises in sequence a substrate, a globally ordered crystalline seed layer with an intermolecular spacing of 3.4±0.3 Å, and at least one layer of an organic compound. The seed layer is formed by rodlike supramolecules comprised of disc-shaped molecules at least one polycyclic organic compound with conjugated π-system. The next layer of an organic compound is epitaxially deposited onto said seed layer.

In other embodiments of the layered organic structure, the substrate is made of any materials of the group comprising plastics, glasses, ceramics, metal-ceramic composites and metals.

In still another embodiment of this invention, the substrate is made of a flexible material. In another embodiment the substrate is made of a rigid material. In this invention, it is possible to use the substrates of various forms selected from the group comprising flat, convex, concave, and geometric shape combining aforesaid forms.

In one more embodiment, the layered organic structure further comprises at least one additional layer absorbing ultraviolet and/or infrared radiation, which is formed on top of the layered organic structure. In another embodiment, the layered organic structure further comprises at least one additional antireflection layer formed on top of the layered organic structure.

Another variant of the embodiment is possible, when said layered organic structure comprises at least one additional protective layer formed on top of the layered organic structure. In one more embodiment, the layered organic structure comprises at least one additional adhesive layer formed on top of the layered organic structure.

According to the disclosed layered organic structure, wherein the organic layer comprises at least one modified organic compound of the general formula where K is a polycyclic organic compound with conjugated π-system, M are modifying functional groups; and n is the number of functional groups.

In a possible embodiment of the disclosed layered organic structure, the organic layer comprises at least one polycyclic organic aromatic conjugated compound, or a derivative of such an organic aromatic conjugated compound, capable of forming supramolecular lyotropic liquid crystal phase.

In another preferred embodiment of the disclosed layered organic structure, the organic layer is based on at least one material selected from the group comprising indanthrone (Vat Blue 4), 1,4,5,8-perylenetetracarboxylic acid dibenzoimidazole (Vat Red 14), 3,4,9,10-perylenetetracarboxylic acid dibenzoimidazole, quinacridone (Pigment Violet 19), 3,4,9,10-pyrylenetetracarboxylic dianhydride (PTCDA), bis-(1,2,5-thiadiazolo)-p-quinobis-(1,3-dithiol) (BTQBT), and aluminum tris(8-hydroxyquinoline) (Alq3).

In another embodiment of the disclosed layered organic structure, the organic layer is based on any phthalocyanine (Pc) or their mixtures selected from the groups comprising metal-free phthalocyanine ($H_2Pc$), $Li_2Pc$, MgPc and other phthalocyanines with monovalent or divalent metal; AlClPc, AlOHPc and other phthalocyanines with a metal halide or a metal hydroxide; TiOPc, $SiCl_2Pc$, $Si(OH)_2Pc$ and other phthalocyanines with tetravalent metals; phthalocyanines in which the central metal ion is replaced by sulfonic acid (or its amide), carboxylic acid, alkyl, aryl, halide, nitro or other phthalocyanine ring; VOPc, CrPc, FePc, CoPc, NiPc, CuPc, ZnPc, $SnCl_2Pc$, PbPc, $Ge(OH)_2Pc$, InBrPc or some other phthalocyanines.

In still another embodiment of this invention, the organic layer is based on one organic compound or their mixtures selected from the group comprising 3,3'-dichlorobenzidine, 2,7-diaminofluorenone, 2,6-diaminoanthraquinone, 2,7-diaminoanthrquinone, (p-aminophenyl)phenylamine, tris(p-aminophenyl)amine, 2,7-diaminodibenzothiophene sulfone, 2,7-diaminodibenzothiophene, 2-(p-aminopheyly)-6-aminobenzoxazole, bis(p-aminophenyl)amine, N-methylbis(p-aminophenyl)amine, 2,5-bis(p-aminophenyl)-1,3,4-oxadiazole, 1,6-diaminopyrene, 1,5-diaminonaphthalene, and some other analogous organic compounds.

In one more embodiment of the layered organic structure, the deposition of at least one organic layer is performed in a buffer gas atmosphere.

The layered organic structures, growth on different substrates (for example, plastic, glass or ceramic), are both unique and powerful technique for optical components engineering. Such layered structures exhibit high optical anisotropy of refraction and absorption indices. These structures transmit one component of the electric field vector and absorb the other component. This effect is known as dichroism.

Along with other applications, one possible way of using of layered organic structure is making E-type polarizer. In E-type polarizers, the extraordinary wave is transmitted while the ordinary wave suffers strong attenuation. The layered organic structures exhibit enhanced viewing angle characteristics.

Figure 1:
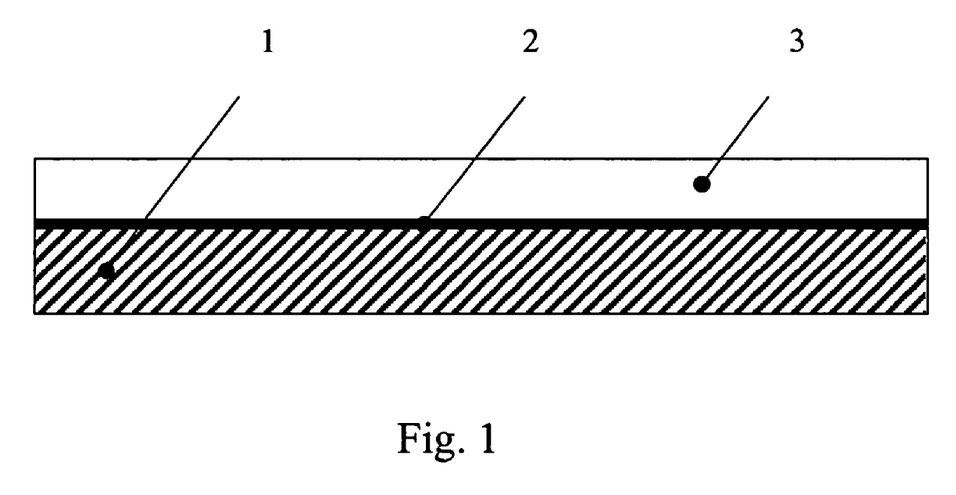
FIG. 1 is the schematic diagram of a layered organic structure comprising a substrate on which a globally ordered crystalline seed layer is formed, said seed layer being covered by an epitaxial organic layer.

FIG. 1 shows such a layered organic structure fabricated as disclosed above. The structure comprises a substrate 1, a globally ordered crystalline seed layer 2 and epitaxial organic layer 3.

Figure 2:
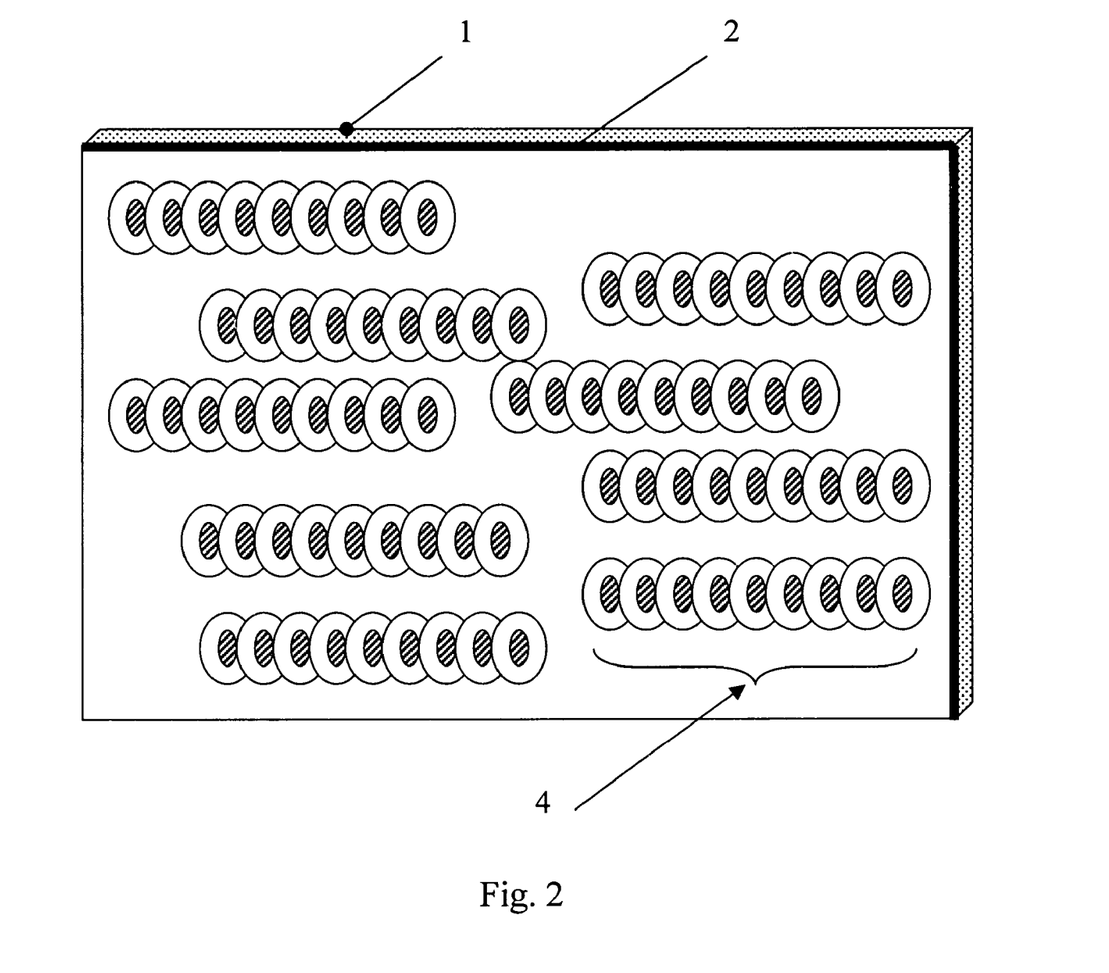
FIG. 2 is the schematic diagram illustrating the structure of a globally ordered anisotropic crystalline seed layer on a substrate.

FIG. 2 is a schematic diagram illustrating the structure of a globally ordered anisotropic crystalline seed layer 2 on a substrate 1. The seed layer is formed by rodlike supramolecules 4 comprised of disc-shaped molecules of at least one polycyclic organic compound with conjugated π-system.

Figure 3:
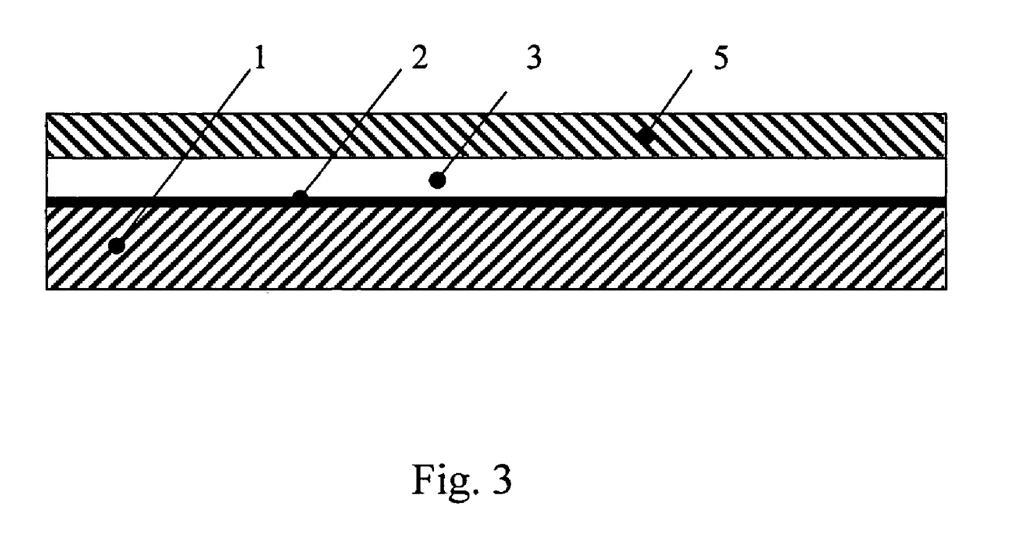
FIG. 3 is the schematic diagram of a layered organic structure with a protective layer on top of the layered organic structure.

FIG. 3 is the schematic diagram of a layered organic structure with a protective layer 5 formed on top of the layered organic structure.

Experimental

A number of experiments were conducted according the method and system of the present invention. The experiments described below are intended for illustration purposes only, and are not intended to limit the scope of the present invention in any way.

In one example, the preparation of a layered organic structure is described. A glass plate with a thickness of 0.5 mm was used as a substrate. A globally ordered anisotropic crystalline seed layer was formed on said substrate by means of the Cascade Crystallization Process. A seed layer material comprised of rodlike supramolecules comprised of disc-shaped molecules of at least one polycyclic organic compound with conjugated π-system. A 9.5% aqueous solution of indanthrone sulfonate was used to form a hexagonal phase at room temperature. This formed supramolecular complexes comprising dye molecules in the solution and these complexes were the basis of the crystal structure of the seed layer. After cleaning the surface, an initial paste of the material was applied onto the substrate. The methods of applying the paste include spilling and smearing. Both techniques gave approximately the same results. The lyotropic liquid crystal was subjected to an external action in order to decrease the viscosity of the liquid crystal for subsequent orientation. In this case, the solution formed a nematic phase or a mixture of a nematic and a hexagonal phase. The viscosity of the system decreased from 1780 to 250 mPa s. Under the conditions of preliminary diluting action decreasing the viscosity of the system, high-quality anisotropic crystal layer was obtained. In the given example, the external diluting action was provided by heating the applied layer from the side of the substrate holder. The substrate holder was heated so as to provide that the temperature of the applied layer of the paste of indanthrone is 56° C. Good results can be also achieved by heating the applied layer using electromagnetic radiation, or by other means. A special variant of the diluting action was the use of a heated Mayer rod for realization of a decrease in the viscosity of a crystal layer with simultaneous orientation.

The next operation was the orientation of supramolecules of the lyotropic liquid crystal. Various orientating tools can be used in order to provide for the required external orientation action. In the given example, the orienting cylindrical Mayer rod No. 4 with a wire wound on it was used, which determined the thickness of a wet layer of 9.5 mm. For realization of the orienting influence, the speed of the Mayer rod motion was 13 mm/sec. A shear strain arising under the Mayer rod action resulted in additional reduction in the viscosity of the system. After orientation, heating of the substrate holder was stopped or the heated Mayer rod was removed.

The next operation in the formation of a seed layer was drying. The solvent should be removed slowly so that the previously achieved orientation of structure of the layer would not be disturbed. In the described example, the drying was carried out at room temperature and a relative humidity of 60%.

As a result, the seed layer with a thickness of 0.3-0.4 microns having a high degree of anisotropy of the optical properties was obtained. The dichroic ratio was Kd=28 at a transmission T=40% (for the traditional method, Kd did not exceed 20), with a good reproducibility of the parameters, both over the surface of a layer and in a series of samples. Perfection of the crystal structure of the resulting seed layers was estimated by optical methods and by X-ray diffractometry. The X-ray diffraction analysis of the seed layers showed that the layer formed as a result of the above technological operations had an intermolecular spacing of 3.4±0.3 Å in the direction of one of the optical axes.

The next step in forming a layered organic structure was the deposition of at least one epitaxial organic layer from the vapor or liquid phase onto the seed layer. In this example, three perylene compounds were sequentially epitaxially deposited onto the seed layer. Perylene derivatives used here were perylene-3,4,9,10-bis(carboxylic acid) diimide (H-PTC), N,N'-dimethylperylene-3,4,9,10-bis(dicarboxmide) (Me-PTC) and N,N'-bis (3,5-xylyl)perylene-3,4,9,10-bis(dicarboximide) (PhMe$_2$-PTC). The deposition rate was controlled at about 2 nm/min. The morphology and molecular orientations of epitaxial organic layers were observed by transmission electron microscopy (TEM) and atomic force microscopy (AFM) [see K. Matsushige, T. Hamano, and T. Horiuchi, "Atomic Force Microscopy Observation of the Epitaxial Growth of Organic Molecules", J. Crystal Growth, 146, 641-644 (1995)]. The analysis executed with the help of transmission electron microscopy (TEM) and atomic force microscope (AFM) has shown that the top surface of the layered structure is very smooth. The line profile analysis shows that molecules of epitaxial organic layer formed on seed layer stand perpendicular to the substrate. These molecules are oriented as well as disc-shape molecules of seed layer. From the AFM images, we can confirm that epitaxial organic layer deposited on seed layer has crystalline structure, which retains the crystalline structure of seed layer.

What is claimed is:

1. A method for obtaining a layered organic structure comprising the following steps:
   (a) providing a substrate,
   (b) forming a globally ordered anisotropic crystalline seed layer on said substrate by means of the Cascade Crystallization Process,
   wherein said seed layer has intermolecular spacing of 3.4±0.3 Å, and said seed layer is formed by rodlike supramolecules comprised of disc-shaped molecules of at least one polycyclic organic compound with conjugated π-system, and
   (c) epitaxially depositing of at least one epitaxial organic layer onto the seed layer.

2. The method according to claim 1, wherein at least one epitaxial organic layer is deposited from the vapor phase.

3. The method according to claim 1, wherein at least one epitaxial organic layer is deposited from the liquid phase.

4. The method according to claim 1, wherein the substrate is made of one or several materials of the group comprising plastics, glasses, ceramics, metal-ceramic composites, and metals.

5. The method according to claim 1, wherein the substrate is made of a flexible material.

6. The method according to claim 1, wherein the substrate is made of a rigid material.

7. The method according to claim 1, wherein the surface of the substrate is flat, convex, concave, or has a geometric shape combining these forms.

8. The method according to claim 1, wherein at least a part of the substrate surface possesses anisotropic properties caused by special chemical bonds.

9. The method according to claims 1, wherein at least a part of the substrate possesses uneven surface in which surface irregularities selected from the group comprising a surface texture, topography, geometry and relief.

10. The method according to claims 9, wherein the surface irregularities are made of the substrate material.

11. The method according to claim 9, wherein the surface irregularities are made of a material different from the substrate material.

12. The method according to claim 1, further comprising a step of formation of at least one alignment layer on said substrate prior to the step of the formation of the seed layer.

13. The method according to claim 12, wherein said alignment layer is formed on the substrate by method of oblique deposition of a special material from the gas (vapor) phase.

14. The method according to claim 13, wherein said special material is silicon dioxide.

15. The method according to claim 12, wherein at least one alignment layer is made of a polymeric material oriented by rubbing in a certain preset direction.

16. The method according to claim 12, wherein at least one said alignment layer is made of a photosensitive polymeric material oriented by exposure to a polarized light.

17. The method according to claim 1, wherein the organic layer comprises at least one modified organic compound of the general formula {K}(M)n, where K is a polycyclic organic compound with conjugated π-system, M are modifying functional groups; and n is the number of functional groups.

18. The method according to claim 1, wherein the organic layer comprises at least one polycyclic organic aromatic conjugated compound capable of forming supramolecular lyotropic liquid crystal phase.

19. The method according to claim 18, wherein the organic layer comprises at least one derivative of said polycyclic organic aromatic conjugated compound, capable of forming supramolecular lyotropic liquid crystal phase.

20. The method according to claim 1, wherein the organic layer comprises at least one material selected from the group comprising indanthrone (Vat Blue 4), 1,4,5,8-perylenetetracarboxylic acid dibenzoimidazole (Vat Red 14), 3,4,9,10-perylenetetracarboxylic acid dibenzoimidazole, quinacridone (Pigment Violet 19), 3,4,9,10-pyrylenetetracarboxylic dianhydride (PTCDA), bis-(1,2,5-thiadiazolo)-p-quinobis-(1,3-dithiol) (BTQBT), and aluminum tris(8-hydroxyquinoline) (Alq3).

21. The method according to claim 1, wherein the organic layer comprises any phthalocyanine (Pc) or their mixtures selected from the groups comprising metal-free phthalocyanine ($H_2Pc$), $Li_2Pc$, MgPc and other phthalocyanines with monovalent or divalent metal; AlClPc, AlOHPc and other phthalocyanines with a metal halide or a metal hydroxide; TiOPc, $SiCl_2Pc$, $Si(OH)_2Pc$ and other phthalocyanines with tetravalent metals; phthalocyanines in which the central metal ion is replaced by sulfonic acid (or its amide), carboxylic acid, alkyl, aryl, halide, nitro or other phthalocyanine ring; VOPc, CrPc, FePc, CoPc, NiPc, CuPc, ZnPc, $SnCl_2Pc$, PbPc, $Ge(OH)_2Pc$, InBrPc or some other phthalocyanines.

22. The method according to claim 1, wherein the organic layer comprises one organic compound or their mixtures selected from the group comprising 3,3'-dichlorobenzidine, 2,7-diaminofluorenone, 2,6-diaminoanthraquinone, 2,7-diaminoanthraquinone, (p-aminophenyl)phenylamine, tris(p-aminophenyl)amine, 2,7-diaminodibenzothiophene sulfone, 2,7-diaminodibenzothiophene, 2-(p-aminophenyl)-6-aminobenzoxazole, bis(p-aminophenyl)amine, N-methylbis(p-aminophenyl)amine, 2,5-bis(p-aminophenyl)-1,3,4-oxadiazole, 1,6-diaminopyrene, 1,5-diaminonaphthalene, and some other analogous organic compounds.

23. The method according to claim 1, wherein the deposition of at least one organic layer is performed in a buffer gas atmosphere.

24. The method according to claim 23, wherein the buffer gas is any gas selected from the list comprising He, Ar, Xe and any other inert gas, $N_2$, $CO_2$, and any other nonreactive gas.

25. A layered organic structure sequentially comprising
a substrate,
a globally ordered crystalline seed layer with an intermolecular spacing of 3.4±0.3 Å, formed by rodlike supramolecules comprised of disc-shaped molecules of at least one polycyclic organic compound with conjugated π-system, and
at least one organic layer comprising organic compound which is epitaxially deposited onto said seed layer.

26. The layered organic structure according to claim 25, wherein the substrate is made of any one or several materials of the group comprising plastics, glasses, ceramics, metal-ceramic composites and metals.

27. The layered organic structure according to claim 25, wherein the substrate is made of a flexible material.

28. The layered organic structure according to claim 25, wherein the substrate is made of a rigid material.

29. The layered organic structure according to any of claims 25 to 28, wherein the surface of the substrate has form selected from the group comprising flat, convex, concave, and geometric shape combining aforesaid forms.

30. The layered organic structure according to claim 25, further comprising at least one additional layer absorbing ultraviolet and/or infrared radiation, which is formed on top of the layered organic structure.

31. The layered organic structure according to claim 25, further comprising at least one additional antireflection layer formed on top of the layered organic structure.

32. The layered organic structure according to claim 25, further comprising at least one additional protective layer formed on top of the layered organic structure.

33. The layered organic structure according to claim 25, further comprising at least one additional adhesive layer formed on top of the layered organic structure.

34. The layered organic structure according to claim 25, wherein the organic layer comprises at least one modified organic compound of the general formula where K is a polycyclic organic compound with conjugated π-system, M are modifying functional groups; and n is the number of functional groups.

35. The layered organic structure according to claim 25, wherein the organic layer comprises at least one polycyclic organic aromatic conjugated compound, or a derivative of such an organic aromatic conjugated compound, capable of forming supramolecular lyotropic liquid crystal phase.

36. The layered organic structure according to claim 25, wherein the organic layer comprises at least one material selected from the group comprising indanthrone (Vat Blue 4), 1,4,5,8-perylenetetracarboxylic acid dibenzoimidazole (Vat Red 14), 3,4,9,10-perylenetetracarboxylic acid dibenzoimidazole, quinacridone (Pigment Violet 19), 3,4,9,10-pyrylenetetracarboxylic dianhydride (PTCDA), bis-(1,2,5-thiadiazolo)-p-quinobis-(1,3-dithiol) (BTQBT), and aluminum tris(8-hydroxyquinoline) (Alq3).

37. The layered organic structure according to claim 25, wherein the organic layer comprises any phthalocyanine (Pc) or their mixtures selected from the groups comprising metal-free phthalocyanine ($H_2Pc$), $Li_2Pc$, MgPc and other phthalocyanines with monovalent or divalent metal; AlClPc, AlOHPc and other phthalocyanines with a metal halide or a metal hydroxide; TiOPc, $SiCl_2Pc$, $Si(OH)_2Pc$ and other phthalocyanines with tetravalent metals; phthalocyanines in which the central metal ion is replaced by sulfonic acid (or its amide), carboxylic acid, alkyl, aryl, halide, nitro or other phthalocyanine ring; VOPc, CrPc, FePc, CoPc, NiPc, CuPc, ZnPc, $SnCl_2Pc$, PbPc, $Ge(OH)_2Pc$, InBrPc or some other phthalocyanines.

38. The layered organic structure according to claim 25, wherein the organic layer comprises one organic compound or their mixtures selected from the group comprising 3,3'-dichlorobenzidine, 2,7-diaminofluorenone, 2,6-diaminoanthraquinone, 2,7-diaminoanthraquinone, (p-aminophenyl)phenylamine, tris(p-aminophenyl)amine, 2,7-diaminodibenzothiophene sulfone, 2,7-diaminodibenzothiophene, 2-(p-aminophenyl)-6-aminobenzoxazole, bis(p-aminophenyl)amine, N-methylbis(p-aminophenyl)amine, 2,5-bis(p-aminophenyl)-1,3,4-oxadiazole, 1,6-diaminopyrene, 1,5-diaminonaphthalene, and some other analogous organic compounds.

39. The layered organic structure according to claim 25, wherein the deposition of at least one organic layer is performed in a buffer gas atmosphere.

* * * * *